United States Patent
Tang et al.

(10) Patent No.: US 12,309,921 B2
(45) Date of Patent: May 20, 2025

(54) BOARD-LEVEL PAD PATTERN FOR MULTI-ROW QFN PACKAGES

(71) Applicant: MEDIATEK INC., Hsin-Chu (TW)

(72) Inventors: Hui-Chi Tang, Hsinchu (TW); Shao-Chun Ho, Hsinchu (TW); Hsuan-Yi Lin, Hsinchu (TW); Pu-Shan Huang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 185 days.

(21) Appl. No.: 18/078,022

(22) Filed: Dec. 8, 2022

(65) Prior Publication Data
US 2023/0217591 A1 Jul. 6, 2023

Related U.S. Application Data

(60) Provisional application No. 63/296,011, filed on Jan. 3, 2022.

(51) Int. Cl.
*H05K 1/02* (2006.01)
*H01L 21/56* (2006.01)
(Continued)

(52) U.S. Cl.
CPC .............. *H05K 1/111* (2013.01); *H05K 1/113* (2013.01); *H05K 1/114* (2013.01); *H05K 1/181* (2013.01);
(Continued)

(58) Field of Classification Search
CPC ...... H05K 1/02; H05K 1/0228; H05K 1/0245; H05K 1/0251; H05K 1/111; H05K 1/113;
(Continued)

(56) References Cited

U.S. PATENT DOCUMENTS 5,155,065 A   10/1992   Schweiss
5,468,999 A * 11/1995   Lin ..................... H01L 24/06
                                                        257/784
(Continued)

FOREIGN PATENT DOCUMENTS

CN   111668185 A   9/2020
CN   212064501 U   12/2020
(Continued)

OTHER PUBLICATIONS

Tang, the specification, including the claims, and drawings in the U.S. Appl. No. 18/076,373, Filing Date: Dec. 6, 2022.
(Continued)

*Primary Examiner* — Xiaoliang Chen
(74) *Attorney, Agent, or Firm* — Winston Hsu

(57) ABSTRACT

A board-level pad pattern includes a printed circuit board (PCB) substrate; an exposed pad region disposed within a surface mount region of the base substrate; and multiple staggered ball pads disposed within the surface mount region arranged in a ring shape around the exposed pad region. The staggered ball pads includes first ball pads arranged in a first row and second ball pads arranged in a second row. The first ball pads in the first row are arranged at two different pitches, and the second ball pads in the second row are arranged at a constant pitch. Multiple square-shaped ball pads are arranged in a third row between the exposed pad region and the staggered ball pads.

16 Claims, 7 Drawing Sheets

(51) Int. Cl.
*H01L 23/00* (2006.01)
*H01L 23/28* (2006.01)
*H01L 23/29* (2006.01)
*H01L 23/34* (2006.01)
*H01L 23/36* (2006.01)
*H01L 23/48* (2006.01)
*H01L 23/482* (2006.01)
*H01L 23/552* (2006.01)
*H01L 23/66* (2006.01)
*H01L 25/16* (2023.01)
*H05K 1/11* (2006.01)
*H05K 1/18* (2006.01)

(52) U.S. Cl.
CPC ........... *H05K 2201/09227* (2013.01); *H05K 2201/09381* (2013.01); *H05K 2201/09409* (2013.01); *H05K 2201/09481* (2013.01); *H05K 2201/0949* (2013.01); *H05K 2201/09609* (2013.01)

(58) Field of Classification Search
CPC ........ H05K 1/114; H05K 1/115; H05K 1/116; H05K 1/144; H05K 1/145; H05K 1/181; H05K 3/0005; H05K 3/0623; H05K 3/341; H05K 3/4007; H05K 3/4038; H05K 2201/0949; H05K 2201/09227; H05K 2201/09381; H05K 2201/09409; H05K 2201/09481; H05K 2201/09609; H01L 21/02225; H01L 21/56; H01L 21/565; H01L 21/4846; H01L 21/4853; H01L 21/5651; H01L 23/00; H01L 23/28; H01L 23/29; H01L 23/34; H01L 23/36; H01L 23/48; H01L 23/66; H01L 23/481; H01L 23/482; H01L 23/552; H01L 23/3128; H01L 23/3135; H01L 23/3436; H01L 23/4334; H01L 23/4984; H01L 23/5226; H01L 23/5283; H01L 23/49503; H01L 23/49541; H01L 23/49517; H01L 23/49575; H01L 23/49805; H01L 23/49811; H01L 23/49816; H01L 23/49838; H01L 23/49548; H01L 23/53228; H01L 24/03; H01L 24/05; H01L 24/06; H01L 24/08; H01L 24/09; H01L 24/11; H01L 24/13; H01L 24/14; H01L 24/16; H01L 24/17; H01L 24/24; H01L 24/29; H01L 24/32; H01L 24/48; H01L 24/49; H01L 24/73; H01L 24/80; H01L 24/81; H01L 24/82; H01L 24/83; H01L 24/92; H01L 24/98; H01L 24/742; H01L 24/3114; H01L 25/0652; H01L 25/0655; H01L 25/0657; H01L 25/16; H01L 25/50
USPC ........... 361/768; 174/250, 254; 257/48, 203, 257/666, 676, 678, 780, 691, 692, 700, 257/737, 738, 773, 777, 778, 779, 784, 257/786, 21.511, 23.021, 23.023, 23.079, 257/23.069, 23.14, 23.151, 23.17; 438/113, 123, 125, 612, 617, 618, 637, 438/666
See application file for complete search history.

(56) References Cited

U.S. PATENT DOCUMENTS

| | | | |
|---|---|---|---|
| 5,962,926 A * | 10/1999 | Torres | H01L 24/06 257/784 |
| 6,091,089 A * | 7/2000 | Hiraga | H01L 24/06 257/E23.079 |
| 6,191,491 B1 | 2/2001 | Hiraga | |
| 6,603,199 B1 * | 8/2003 | Poddar | H01L 24/49 257/691 |
| 6,700,208 B1 * | 3/2004 | Yoneda | H01L 24/06 257/784 |
| 8,471,154 B1 | 6/2013 | Yoshida | |
| 8,723,337 B2 | 5/2014 | Howard | |
| 9,831,205 B2 * | 11/2017 | Chen | H01L 24/06 |
| 10,231,325 B1 * | 3/2019 | Chengson | H05K 3/0005 |
| 11,173,714 B1 | 11/2021 | Zhang | B41J 2/14201 |
| 11,450,633 B2 * | 9/2022 | Lin | H01L 25/50 |
| 2002/0070451 A1 * | 6/2002 | Burnette | H01L 23/49838 257/737 |
| 2003/0197251 A1 * | 10/2003 | Nakamura | H01L 24/05 438/618 |
| 2004/0004296 A1 * | 1/2004 | Cheng | H01L 23/552 257/E23.079 |
| 2005/0040539 A1 * | 2/2005 | Carlsgaard | H01L 24/13 257/E21.511 |
| 2006/0232301 A1 * | 10/2006 | Morlion | H05K 1/114 326/126 |
| 2007/0096338 A1 * | 5/2007 | Kim | H05K 3/3436 257/E23.07 |
| 2007/0187808 A1 * | 8/2007 | Mihelcic | H01L 23/50 257/E23.079 |
| 2008/0012645 A1 * | 1/2008 | Ichitsubo | H03F 3/189 330/307 |
| 2008/0048319 A1 * | 2/2008 | Ahn | H01L 24/05 257/737 |
| 2008/0093749 A1 * | 4/2008 | Gerber | H01L 23/49816 257/784 |
| 2009/0166620 A1 * | 7/2009 | Maede | H01L 24/49 257/E27.07 |
| 2009/0301764 A1 * | 12/2009 | Kawamura | B24B 31/06 451/36 |
| 2009/0302451 A1 * | 12/2009 | Matsubara | H01L 24/49 257/691 |
| 2010/0001392 A1 | 1/2010 | Cho | |
| 2010/0078800 A1 | 4/2010 | Aboush | |
| 2010/0133535 A1 | 6/2010 | Ojiro | |
| 2012/0007195 A1 | 1/2012 | Zhao | |
| 2012/0273972 A1 * | 11/2012 | Kawai | H01L 24/49 257/E23.06 |
| 2013/0292815 A1 * | 11/2013 | Tashiro | H01L 24/49 257/676 |
| 2014/0027919 A1 * | 1/2014 | Nakayama | H01L 21/4853 257/773 |
| 2014/0099123 A1 * | 4/2014 | Kang | H05K 1/0251 174/254 |
| 2014/0193954 A1 * | 7/2014 | Taoka | H01L 23/5226 438/125 |
| 2015/0041985 A1 * | 2/2015 | Hsieh | H01L 23/5329 257/773 |
| 2015/0115454 A1 * | 4/2015 | Magnus | H01L 24/19 257/773 |
| 2015/0145132 A1 | 5/2015 | Ramakrishnan | |
| 2015/0325543 A1 * | 11/2015 | Katkar | H01L 24/13 219/121.64 |
| 2016/0119564 A1 | 4/2016 | Suzuki | |
| 2016/0248140 A1 * | 8/2016 | Zhang | H01P 5/10 |
| 2019/0318990 A1 * | 10/2019 | Nakagawa | H01L 24/17 |
| 2020/0196449 A1 * | 6/2020 | Gera | H05K 1/111 |
| 2020/0402893 A1 * | 12/2020 | Chang | H01L 23/49548 |
| 2021/0233865 A1 * | 7/2021 | Tarui | H01Q 21/065 |
| 2022/0157705 A1 * | 5/2022 | Yin | H01L 21/4846 |
| 2022/0415844 A1 * | 12/2022 | Tang | H01L 24/48 |
| 2024/0251610 A1 * | 7/2024 | Dong | H01L 24/29 |

FOREIGN PATENT DOCUMENTS

| | | |
|---|---|---|
| EP | 4 096 371 A1 | 11/2022 |
| JP | 10-74790 A | 3/1998 |
| JP | 2004-77386 A | 3/2004 |
| JP | 2007-294768 A | 11/2007 |
| JP | 2011-114071 A | 6/2011 |

(56) References Cited

FOREIGN PATENT DOCUMENTS

| | | |
|---|---|---|
| JP | 2021-28927 A | 2/2021 |
| WO | 2020/196752 A1 | 10/2020 |
| WO | 2021/179504 A1 | 9/2021 |

OTHER PUBLICATIONS

Tang, the specification, including the claims, and drawings in the U.S. Appl. No. 18/078,056, Filing Date: Dec. 8, 2022.

\* cited by examiner

BOARD-LEVEL PAD PATTERN FOR MULTI-ROW QFN PACKAGES

CROSS REFERENCE TO RELATED APPLICATIONS

This application claims the benefit of U.S. Provisional Application No. 63/296,011, filed on Jan. 3, 2022. The content of the application is incorporated herein by reference.

BACKGROUND

The present disclosure relates to ball pad (or finger pad) layout of a base substrate. More particularly, the present disclosure relates to a board-level ball pad pattern with differential pair routing for multi-row Quad Flat No lead (QFN) packages.

The continuous advancement in technology and miniaturization of electronic components, hand held and communication devices require superior thermal-electrical performance and miniature packages. An advanced and complicated Integrated Circuit (IC) device often demands increase in number of I/O's while maintaining its small size, footprint and weight. A dual-row QFN is an ideal solution for such demanding applications.

The multi-row QFN package is a plastic-encapsulated package with a copper leadframe substrate. The exposed die attach paddle on the bottom efficiently conducts heat to the PCB and provides a stable ground through down bonds or by electrical connections through conductive die attach material. The design of multi-row QFN packages allows for flexibility and enhances electrical performance to very high-speed operating frequencies.

As known in the art, differential signaling has been employed on PCB routing for the multi-row QFN packages, which uses two complementary signals to transmit the one data signal, but the second signal is inverted from the first. The signal receiver uses the difference between the inverted and non-inverted signals to decipher the information. Using differential pair routing to transmit signals has benefits such as reduction in noise and EMI. However, the drawback is that it takes up more space.

Further, to get the best performance out of the differential pair routing, the lines must be equal in length and the pairs must be routed together and at the same widths, which can be a problem when routing around obstacles on the circuit board such as vias or smaller components.

Board Level Reliability (BLR) is known as an interconnect reliability testing, which is used to evaluate the quality and reliability of solder connections after mounting an IC package to a PCB. For various electronics packages such as IC and area array packages (BGA, CSP etc.), the reliability of the solder joint during thermal cycling test is a critical issue.

SUMMARY

One object of the present invention is to provide an improved board-level ball pad pattern in order to solve the prior art problems or shortcomings.

One aspect of the invention provides a board-level pad pattern including a base substrate; an exposed pad region disposed within a surface mount region of the base substrate; a plurality of staggered ball pads disposed within the surface mount region arranged in a ring shape around the exposed pad region, wherein the plurality of staggered ball pads comprises first ball pads arranged in a first row and second ball pads arranged in a second row, wherein the first ball pads in the first row are arranged at two different pitches, and the second ball pads in the second row are arranged at a constant pitch; and a plurality of square-shaped ball pads arranged in a third row between the exposed pad region and the plurality of staggered ball pads.

According to some embodiment, the plurality of staggered ball pads and the plurality of square-shaped ball pads are copper pads.

According to some embodiment, the plurality of staggered ball pads and the plurality of square-shaped ball pads are non-solder mask defined (NSMD) pads.

According to some embodiment, the first ball pads in the first row are aligned to one another along a first direction.

According to some embodiment, the second ball pads in the second row are aligned to one another along the first direction.

According to some embodiment, the square-shaped ball pads in the third row are aligned to one another along the first direction.

According to some embodiment, the first and second ball pads are arranged in a staggered manner in a second direction that is orthogonal to the first direction.

According to some embodiment, the first ball pads in the first row are arranged at a pitch of 0.5 mm and a pitch of 0.7 mm.

According to some embodiment, the second ball pads in the second row are arranged at a pitch of 0.4 mm.

According to some embodiment, the board-level pad pattern further includes a basic pad unit consisting of five pads composed of two of the first ball pads in the first row and three of the second ball pads in the second row.

According to some embodiment, an array of the plurality of staggered ball pads within the surface mount region for the multi-row QFN is constructed by repeating the basic pad units.

According to some embodiment, the board-level pad pattern further includes a plurality of signal vias electrically connected to the plurality of square-shaped ball pads, respectively.

According to some embodiment, the plurality of signal vias are arranged in a staggered manner along each side of the exposed pad region.

According to some embodiment, the plurality of signal vias comprise alternately arranged offset signal vias and on-pad signal vias.

According to some embodiment, the plurality of signal vias are arranged in an aligned manner along each side of the exposed pad region.

According to some embodiment, the plurality of signal vias are all on-pad signal vias.

According to some embodiment, the board-level pad pattern further includes a plurality of square-shaped ground pads between the plurality of square-shaped ball pads in the third row.

According to some embodiment, the plurality of ground pads are electrically connected to respective on-pad ground vias, which are electrically connected to a ground plane of the base substrate.

According to some embodiment, each of the plurality of square-shaped ball pads in the third row has a dimension of about 0.4 mm×0.4 mm.

Another aspect of the invention provides a semiconductor device including a base substrate; an exposed pad region disposed within a surface mount region of the base substrate; a plurality of staggered ball pads disposed within the surface mount region arranged in a ring shape around the exposed pad region, wherein the plurality of staggered ball pads comprises first ball pads arranged in a first row and second ball pads arranged in a second row, wherein the first ball pads in the first row are arranged at two different pitches, and the second ball pads in the second row are arranged at a constant pitch. A plurality of square-shaped ball pads is arranged in a third row between the exposed pad region and the plurality of staggered ball pads. A multi-row QFN package is mounted on the surface mount region of the base substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1:
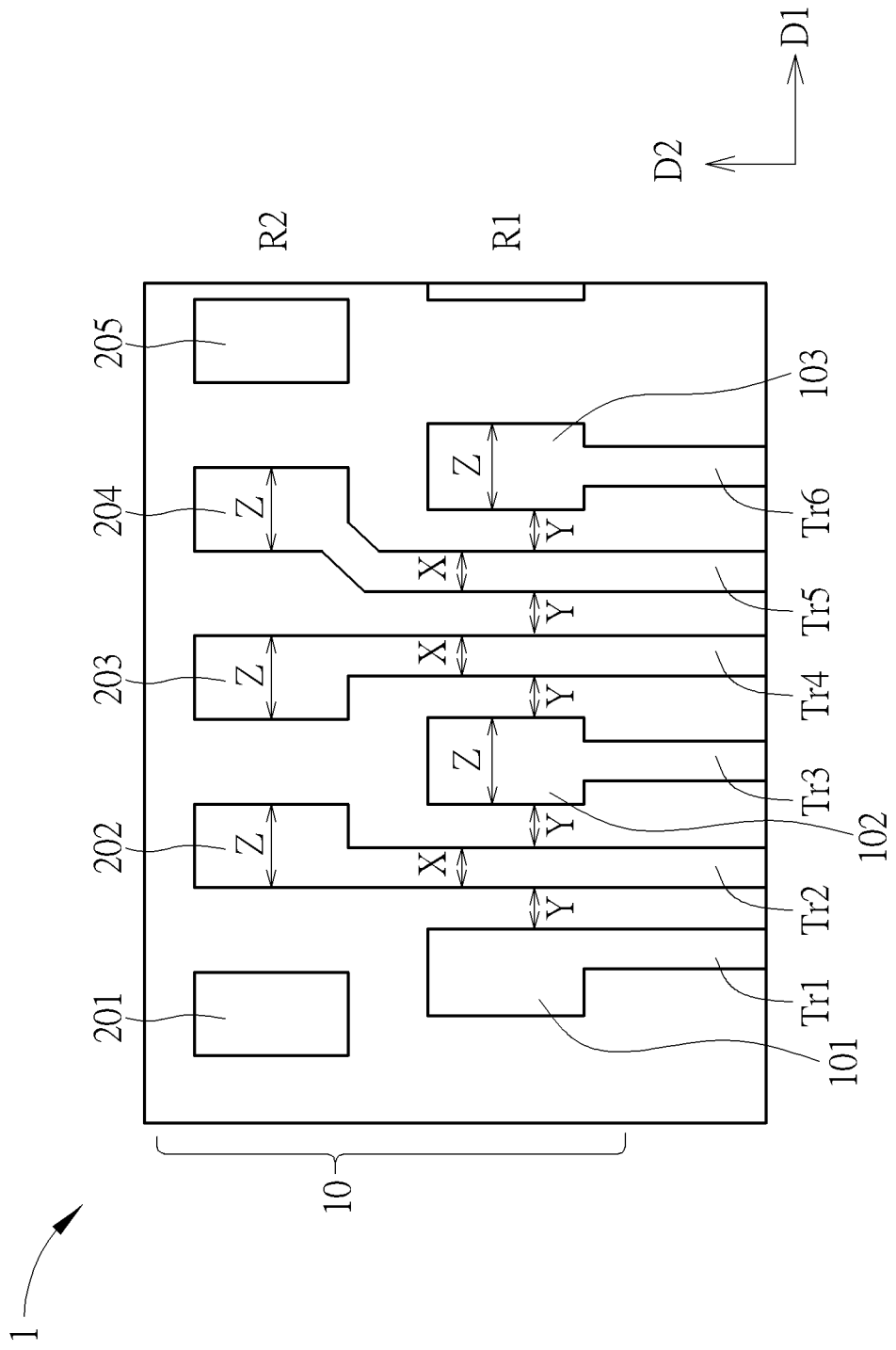
FIG. 1 shows a germane portion of an exemplary PCB top layer of a layout of ball pads for a multi-row QFN package according to one embodiment of the invention.
Figure 2:
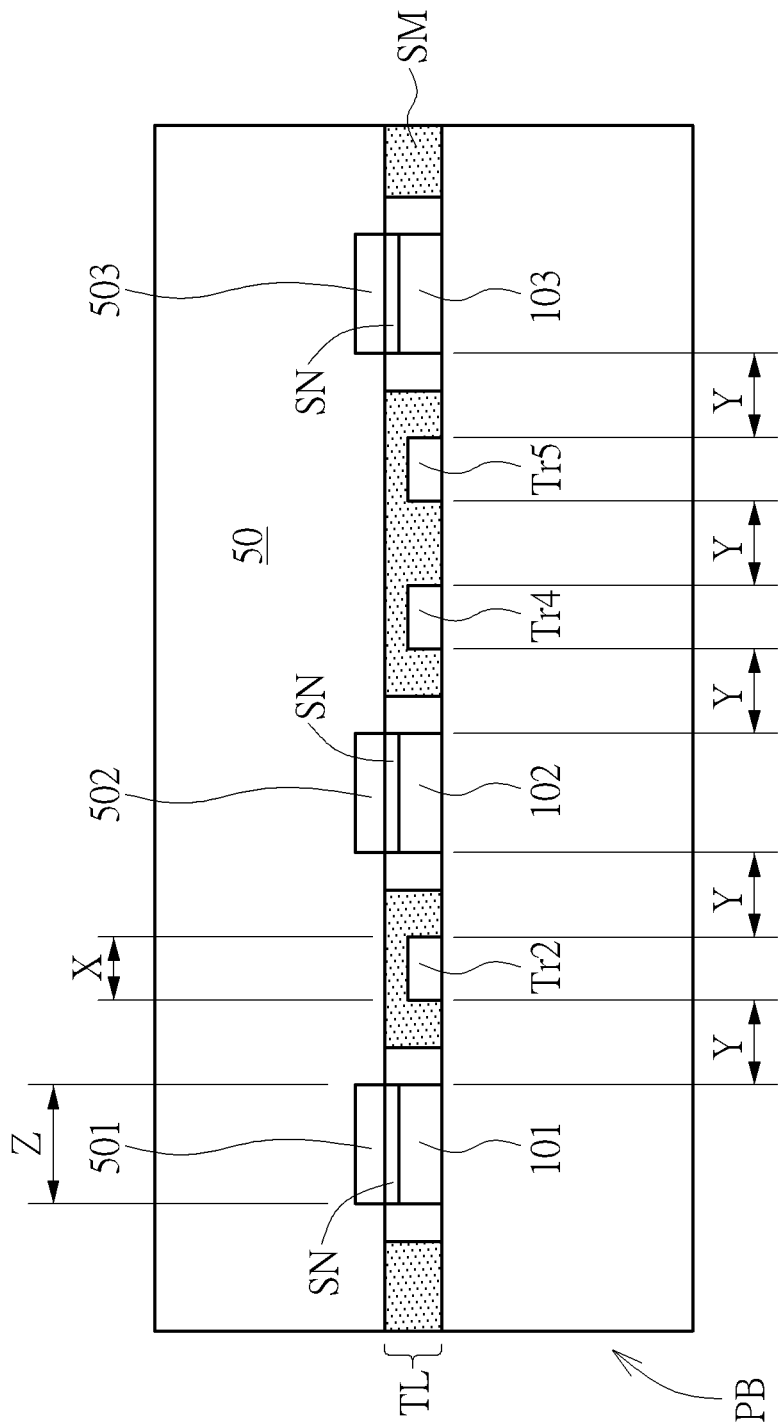
FIG. 2 is a schematic, cross-sectional diagram taken along line I-I' in FIG. 1 after the assembly of the multi-row QFN package.

FIG. 1 is a schematic diagram showing a germane portion of an exemplary base top layer of a layout of ball pads for a multi-row QFN package according to one embodiment of the invention. FIG. 2 is a schematic, cross-sectional diagram taken along line I-I' in FIG. 1 after the assembly of the multi-row QFN package. As shown in FIG. 1 and FIG. 2, the ball pad layout 1 fabricated in the top layer TL of a base substrate PB comprises staggered ball pads (or finger pads) including, for example, ball pads 101-103 arranged in the first row R1 and ball pads 201-205 arranged in the second row R2. According to an embodiment of the invention, for example, the ball pads 101-103 and 201-205 may be copper pads, but is not limited thereto. The base substrate PB may comprise a printed circuit board (PCB) or a package substrate, but is not limited thereto.

According to an embodiment of the invention, the ball pads 101-103 and 201-205 are disposed within a surface mount region 10 for mounting a multi-row QFN package 50 (FIG. 2) using surface mount techniques known in the art. The leads 501-503 on the bottom side of the multi-row QFN package 50 may be bonded to corresponding ball pads 101-103 and 201-205 with solder joints SN to form electrical connection paths. According to an embodiment of the invention, for example, the ball pads 101-103 and 201-205 may be non-solder mask defined (NSMD) pads. For the sake of simplicity, the solder mask is omitted in FIG. 1.

According to an embodiment of the invention, the ball pads 101-103 arranged in the first row R1 are approximately aligned to one another along the first direction D1. According to an embodiment of the invention, the ball pads 201-205 arranged in the second row R2 are approximately aligned to one another along the first direction D1. According to an embodiment of the invention, the ball pads 101-103 and 201-205 may be arranged in a staggered manner in the second direction D2 that is orthogonal to the first direction D1.

According to an embodiment of the invention, for example, the ball pad 101 may be connected to a trace Tr1, the ball pad 202 may be connected to a trace Tr2, the ball pad 102 may be connected to a trace Tr3, the ball pad 203 may be connected to a trace Tr4, the ball pad 204 may be connected to a trace Tr5, and the ball pad 103 may be connected to a trace Tr6. According to an embodiment of the invention, for example, the traces Tr1-Tr6 may extend along the second direction D2.

According to an embodiment of the invention, for example, only the trace Tr2 passes through the routing space between the ball pad 101 and ball pad 102 in the first row R1. According to an embodiment of the invention, for example, the two adjacent traces Tr4 and Tr5 pass through the routing space between the ball pad 102 and ball pad 103 in the first row R1. According to an embodiment of the invention, for example, the traces Tr4 and Tr5 are designated as a differential pair, and the adjacent balls pads 103 and 103 are designated as ground pads, thereby constituting a ground-signal-signal-ground (GSSG) routing configuration. In FIG. 1, the width of each of the ball pads 101-103 and 201-205 is labeled as Z, the width of each of the traces Tr1-Tr6 is labeled as X, and the space between the passing traces Tr2, Tr4 and Tr5 and the ball pads 101-103 is labeled as Y.

Figure 3:
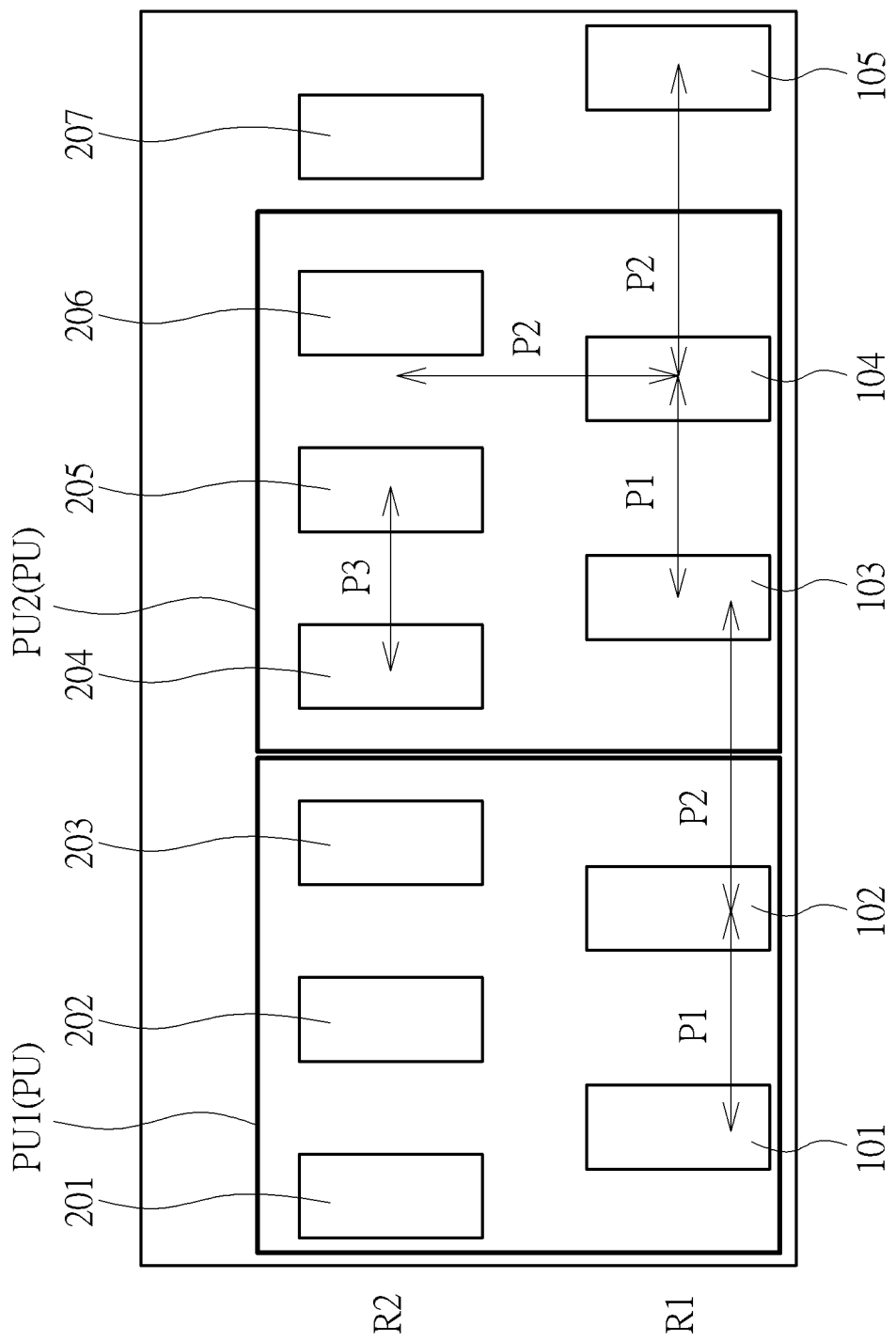
FIG. 3 schematically shows the partial ball pad layout for a multi-row QFN package and the pad pitches according to an embodiment of the invention.

FIG. 3 schematically shows the partial layout of the ball pads and the pad pitches according to an embodiment of the invention. For the sake of simplicity, the solder mask and the traces are omitted in FIG. 3. As shown in FIG. 3, according to an embodiment of the invention, the ball pads 101-105 in the first row R1 are arranged at two different pitches P1 and P2, for example, P1=0.5 mm and P2=0.7 mm. According to an embodiment of the invention, P1=X+2Y+Z and P2=2X+3Y+Z. According to an embodiment of the invention, for example, the ball pads 201-205 in the second row R2 are arranged at a constant pitch P3 of about 0.4 mm, which is equal to the width Z of each of the ball pads 101-105 plus the interval of two adjacent ball pads of about 0.18-0.2 mm (P3=Z+V, where V=0.18-0.2 mm). According to an embodiment of the invention, for example, the width Z of each of the ball pads 101-105 is 0.2 mm. The first row R1 and the second row R2 are arranged with pitch P2.

FIG. 3 also illustrates a basic pad unit PU consisting of five pads. For example, the basic pad unit PU1 is composed of two ball pads 101 and 102 in the first row R1 and three ball pads 201-203 in the second row R2, and the next basic pad unit PU2 is composed of two ball pads 103 and 104 in the first row R1 and three ball pads 204-206 in the second row R2. The array of the ball pads for the multi-row QFN is constructed by repeating the basic pad units PU.

It is advantageous to use the present invention because the number of the ball pads can be increased by 4.5% for a 12.7 mm×12.7 mm dual-row QFN package (from 176 pins to 186 pins). Alternatively, the size of the dual-row QFN package can be reduced by 7.7% for a 176-pin dual-row QFN package (from 12.7 mm×12.7 mm to 12.2 mm×12.2 mm). Further, it is easier to assign the differential pair when routing the layout for the multi-row QFN packages.

Figure 4:
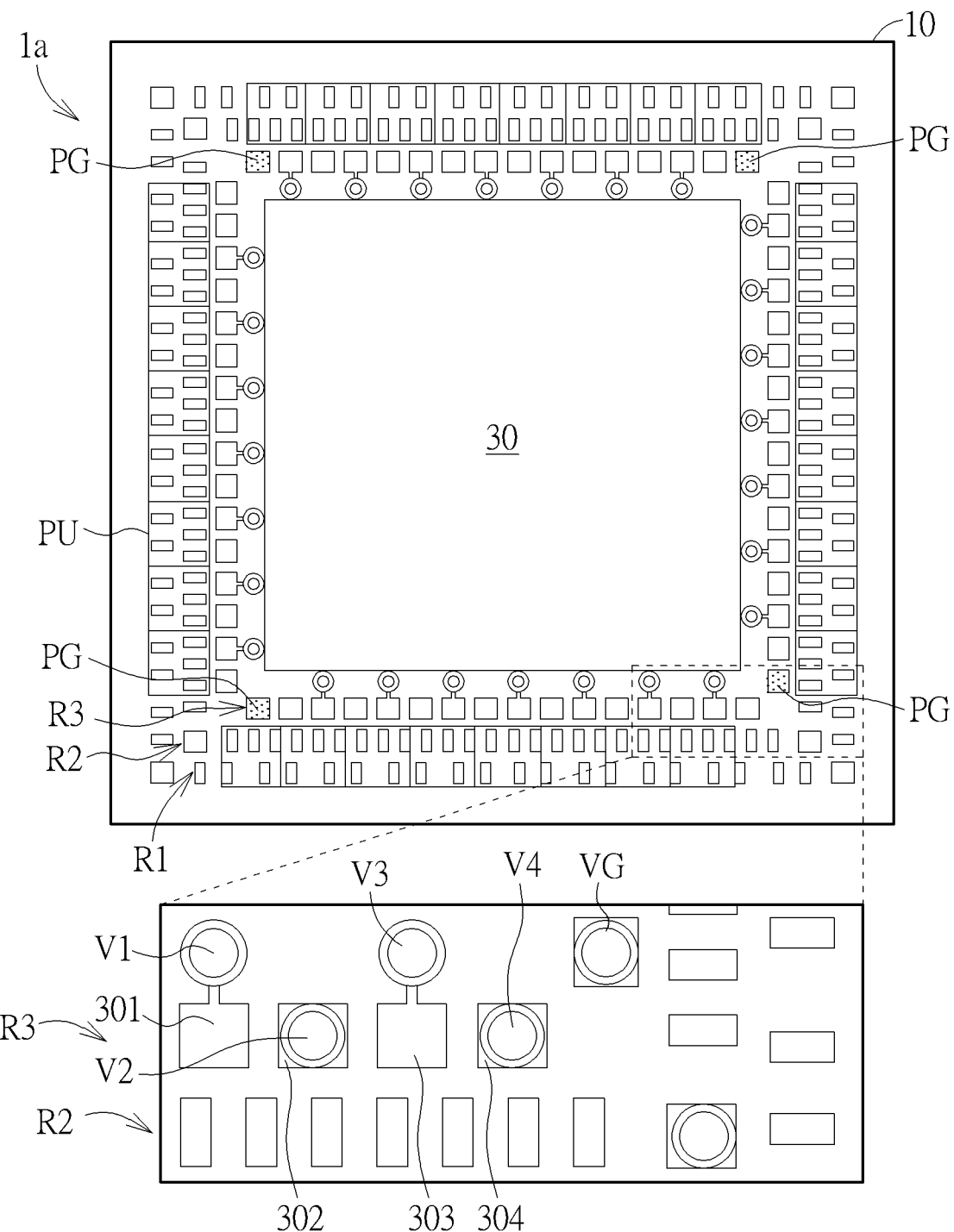
FIG. 4 is a schematic layout diagram showing an exemplary surface mount region of a base substrate for mounting a triple-row QFN package according to an embodiment of the invention.

FIG. 4 is a schematic layout diagram showing an exemplary surface mount region 10 for mounting a triple-row QFN package according to an embodiment of the invention. As shown in FIG. 4, the ball pad layout 1a fabricated in the top layer of a base substrate comprises a plurality of repeating basic pad units PU as set forth in FIG. 3, thereby forming the first row R1 and the second row R2 of the ball pad layout 1a, which are arranged in a ring shape surrounding an exposed pad region 30. The ball pad layout 1a further comprises a plurality of square-shaped pads in the third row R3, for example, the square-shaped pads 301-304 as shown in the enlarged view, which is disposed between the exposed pad region 30 and the second row R2.

For example, each ball pad of the basic pad units PU may have a dimension of about 0.2 mm×0.4 mm, and the square-shaped pads in the third row R3 may have a dimension of about 0.4 mm×0.4 mm. According to an embodiment of the invention, for example, the square-shaped pads in the third row R3 may be copper pads, but is not limited thereto. According to an embodiment of the invention, for example, the plurality of square-shaped pads in the third row R3 may be non-solder mask defined (NSMD) pads. The square-shaped pads in the third row R3 can improve the board level reliability (BLR).

According to an embodiment, the ball pad layout 1a has a staggered signal via configuration. For example, the exemplary square-shaped pads 301 and 303 are connected to offset signal vias V1 and V3, respectively. The offset signal vias V1 and V3 are disposed in proximity to the square-shaped pads 301 and 303, respectively. The offset signal via V1 does not overlap with the square-shaped pad 301. The offset signal via V3 does not overlap with the square-shaped pad 303. The exemplary square-shaped pads 302 and 304 are connected to on-pad signal vias V2 and V4, respectively.

FIG. 4 also shows four exemplary ground pads PG disposed adjacent to the corners of the exposed pad region 30. The four exemplary ground pads PG are electrically connected to respective on-pad ground vias VG, which are electrically connected to a ground plane (not explicitly shown) of the base substrate.

Figure 5:
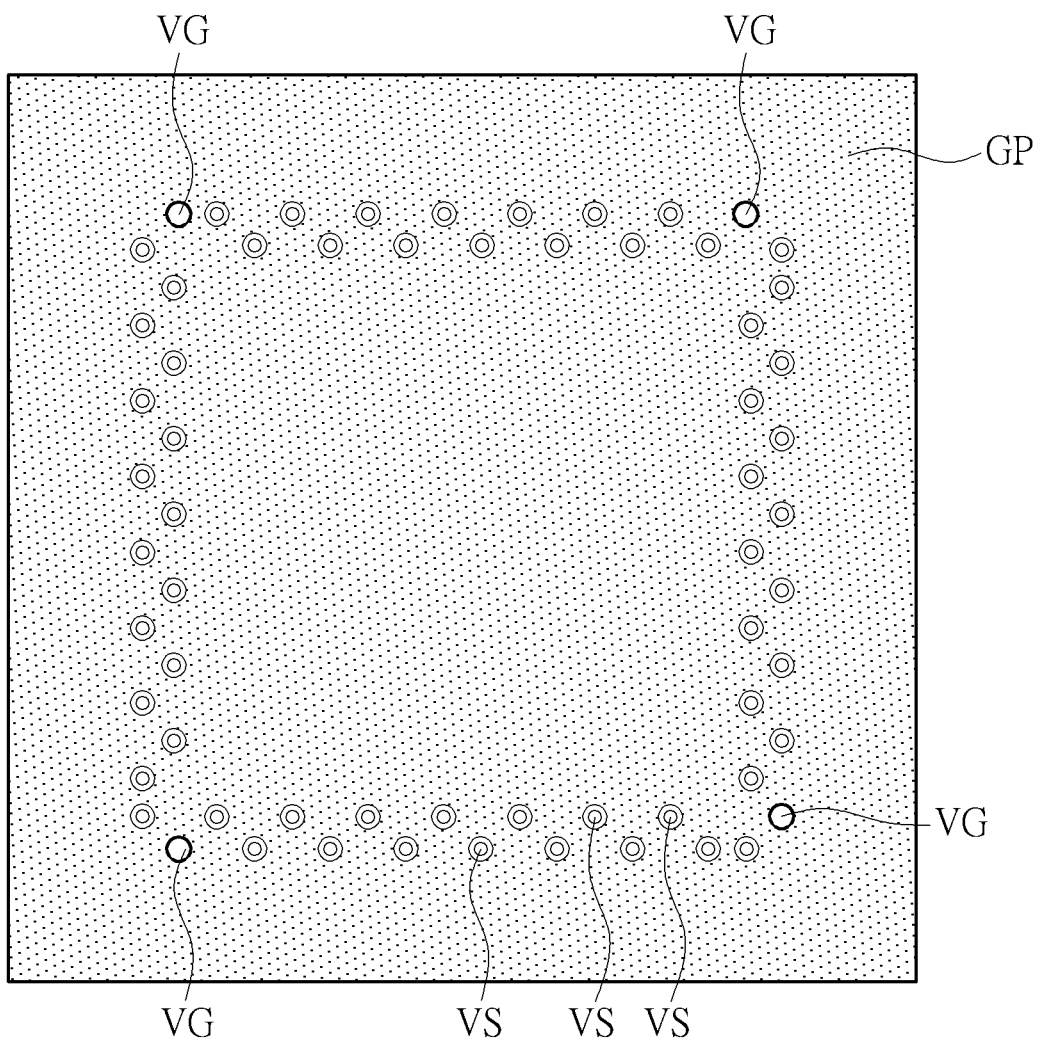
FIG. 5 shows a layout of the staggered, third-row signal vias in FIG. 4 and the ground plane of the base substrate according to an embodiment of the invention.

FIG. 5 shows a layout of the staggered, third row signal vias and the ground plane of the base substrate according to an embodiment of the invention. As shown in FIG. 5, the four exemplary on-pad ground vias VG electrically connected to respective ground pads PG in FIG. 4 are electrically connected to the ground plane GP. The signal vias VS penetrate through the ground plane GP and are electrically connected to respective signal traces (not explicitly shown) in the base substrate. By providing such staggered signal via configuration, the ground plane GP can have better connection for transmitting the ground signal.

Figure 6:
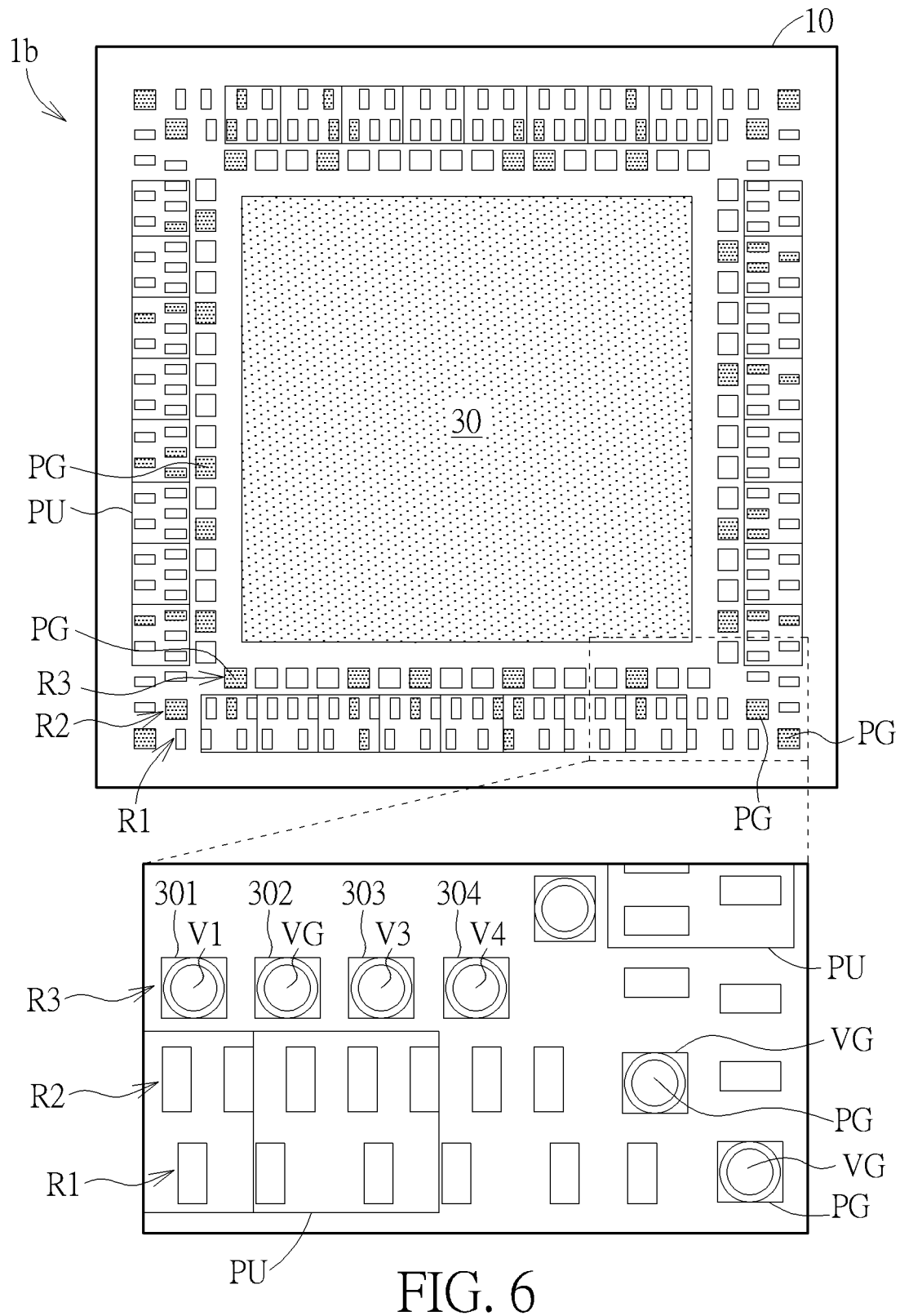
FIG. 6 is a schematic layout diagram showing an exemplary surface mount region of a base substrate for mounting a triple-row QFN package according to another embodiment of the invention.

FIG. 6 is a schematic layout diagram showing an exemplary surface mount region 10 for mounting a triple-row QFN package according to another embodiment of the invention, wherein like regions, layers or elements are designated by like numeral numbers or labels. As shown in FIG. 6, likewise, the ball pad layout 1b fabricated in the top layer of a base substrate comprises a plurality of repeating basic pad units PU as set forth in FIG. 3, thereby forming the first row R1 and the second row R2 of the ball pad layout 1a, which are arranged in a ring shape surrounding an exposed pad region 30. The ball pad layout 1b further comprises a plurality of square-shaped pads in the third row R3, for example, the square-shaped pads 301-304 as shown in the enlarged view, which is disposed between the exposed pad region 30 and the second row R2. For example, each ball pad of the basic pad units PU may have a dimension of about 0.2 mm×0.4 mm, and the square-shaped pads in the third row R3 may have a dimension of about 0.4 mm×0.4 mm.

According to an embodiment, the third row R3 of the ball pad layout 1b has all-on-pad signal via configuration. For example, as shown in the enlarged view, the exemplary square-shaped pads 301, 303 and 304 are connected to signal vias V1, V3 and V4, respectively. The exemplary square-shaped pad 302 is connected to a ground via VG. FIG. 4 also shows randomly assigned exemplary ground pads PG disposed around the exposed pad region 30. The ground pads PG are electrically connected to respective on-pad ground vias VG, which are electrically connected to a ground plane (not explicitly shown) of the base substrate.

Figure 7:
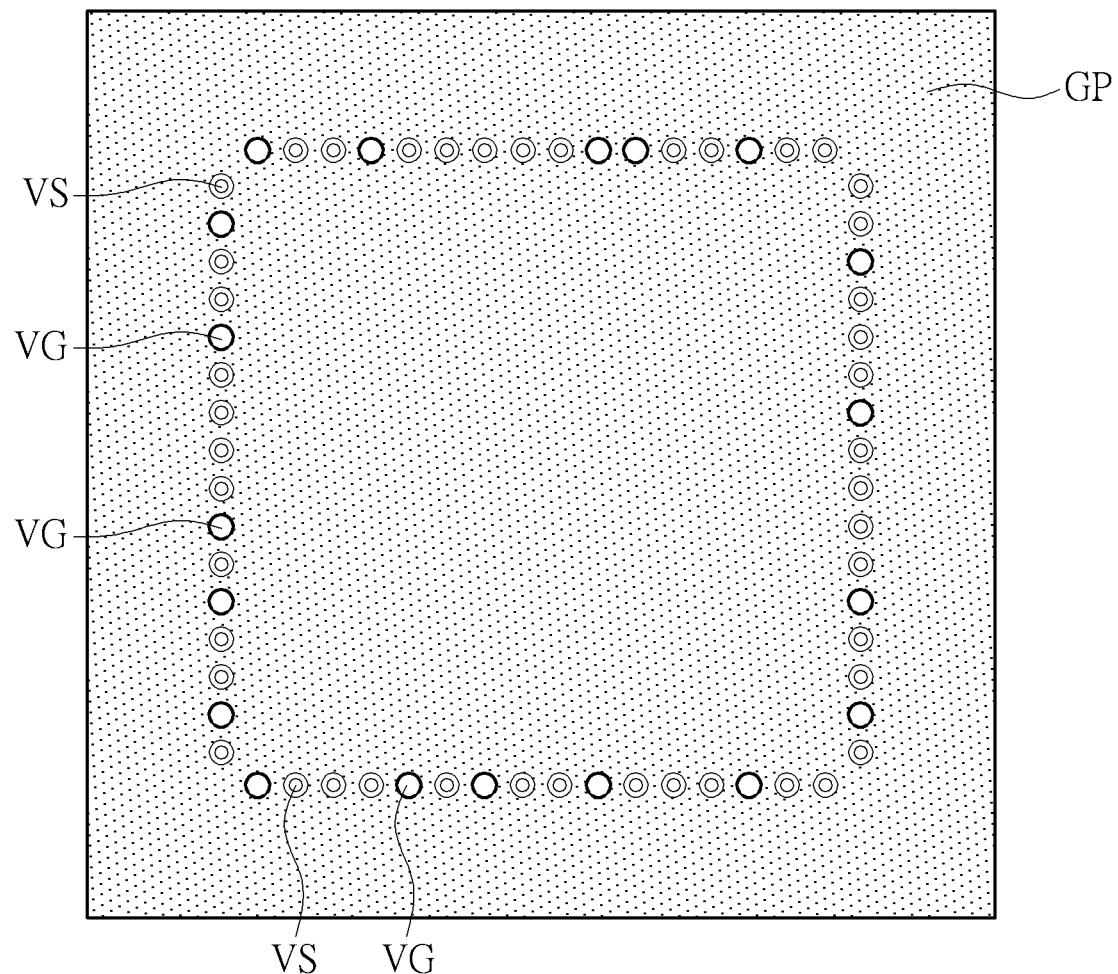
FIG. 7 shows a layout of the third-row signal vias in FIG. 6 and the ground plane of the base substrate according to another embodiment of the invention.

FIG. 7 shows a layout of the third-row signal vias and the ground plane of the base substrate according to another embodiment of the invention. As shown in FIG. 7, the exemplary on-pad ground vias VG electrically connected to respective ground pads PG in FIG. 6 are electrically connected to the ground plane GP. The signal vias VS penetrate through the ground plane GP and are electrically connected to respective signal traces (not explicitly shown) in the base substrate. By providing such signal via configuration, the integrity of the ground plane GP can be improved and the ground plane GP can have better connection for transmitting the ground signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A board-level pad pattern, comprising:
   a base substrate;
   an exposed pad region disposed within a surface mount region of the base substrate;
   a plurality of staggered ball pads disposed within the surface mount region arranged in a ring shape around the exposed pad region, wherein the plurality of staggered ball pads comprises first ball pads arranged in a first row and second ball pads arranged in a second row, wherein the first ball pads in the first row are arranged at two different pitches, and the second ball pads in the second row are arranged at a constant pitch;
   a plurality of square-shaped ball pads arranged in a third row between the exposed pad region and the plurality of staggered ball pads; and
   a plurality of signal vias electrically connected to the plurality of square-shaped ball pads, respectively, wherein the plurality of signal vias are arranged in a staggered manner along each side of the exposed pad region, wherein the plurality of signal vias comprise alternately arranged offset signal vias and on-pad signal vias.

2. The board-level pad pattern according to claim 1, wherein the plurality of staggered ball pads and the plurality of square-shaped ball pads are copper pads.

3. The board-level pad pattern according to claim 1, wherein the plurality of staggered ball pads and the plurality of square-shaped ball pads are non-solder mask defined (NSMD) pads.

4. The board-level pad pattern according to claim 1, wherein the first ball pads in the first row are aligned to one another along a first direction.

5. The board-level pad pattern according to claim 4, wherein the second ball pads in the second row are aligned to one another along the first direction.

6. The board-level pad pattern according to claim 4, wherein the square-shaped ball pads in the third row are aligned to one another along the first direction.

7. The board-level pad pattern according to claim 5, wherein the first and second ball pads are arranged in a staggered manner in a second direction that is orthogonal to the first direction.

8. The board-level pad pattern according to claim 1, wherein the first ball pads in the first row are arranged at a pitch of 0.5 mm and a pitch of 0.7 mm.

9. The board-level pad pattern according to claim 1, wherein the second ball pads in the second row are arranged at a pitch of 0.4 mm.

10. The board-level pad pattern according to claim 1 further comprising:
    a basic pad unit consisting of five pads composed of two of the first ball pads in the first row and three of the second ball pads in the second row.

11. The board-level pad pattern according to claim 10, wherein an array of the plurality of staggered ball pads within the surface mount region for the multi-row QFN is constructed by repeating the basic pad units.

12. The board-level pad pattern according to claim 1, wherein the plurality of signal vias are arranged in an aligned manner along each side of the exposed pad region.

13. The board-level pad pattern according to claim 12, wherein the plurality of signal vias are all on-pad signal vias.

14. The board-level pad pattern according to claim 1 further comprising:
    a plurality of square-shaped ground pads between the plurality of square-shaped ball pads in the third row.

15. The board-level pad pattern according to claim 14, wherein the plurality of ground pads are electrically connected to respective on-pad ground vias, which are electrically connected to a ground plane of the base substrate.

16. The board-level pad pattern according to claim 1, wherein each of the plurality of square-shaped ball pads in the third row has a dimension of about 0.4 mm×0.4 mm.

* * * * *